(12) United States Patent
Kornek et al.

(10) Patent No.: US 10,819,449 B2
(45) Date of Patent: Oct. 27, 2020

(54) METHOD AND SYSTEM FOR NEAR-FIELD LOCALIZATION

(71) Applicant: Robert Bosch (Australia) Pty Ltd, Clayton, Victoria (AU)

(72) Inventors: Daniel Kornek, Brunswick East (AU); Andrew Thompson, Clayton (AU)

(73) Assignee: ROBERT BOSCH (AUSTRALIA) PTY LTD, Clayton (AU)

(*) Notice: Subject to any disclaimer, the term of this patent is extended or adjusted under 35 U.S.C. 154(b) by 300 days.

(21) Appl. No.: 15/987,552

(22) Filed: May 23, 2018

(65) Prior Publication Data
US 2018/0343071 A1    Nov. 29, 2018

(30) Foreign Application Priority Data

May 29, 2017   (AU) .................................. 2017902021

(51) Int. Cl.
*H04B 17/27*    (2015.01)
*G01S 11/12*    (2006.01)
(Continued)

(52) U.S. Cl.
CPC .............. *H04B 17/27* (2015.01); *B60L 53/38* (2019.02); *G01B 7/003* (2013.01); *G01R 33/02* (2013.01); *G01S 11/12* (2013.01); *H04B 17/318* (2015.01)

(58) Field of Classification Search
CPC ....... H04B 17/27; H04B 17/318; G01S 11/12; G01R 33/02; B60L 53/38; G01B 7/003
(Continued)

(56) References Cited

U.S. PATENT DOCUMENTS

9,112,645 B2 *   8/2015   Hassan ................... H04L 1/002
2006/0267833 A1 *   11/2006   Langford .............. G01S 5/0252
342/174
(Continued)

*Primary Examiner* — Tan Q Nguyen
(74) *Attorney, Agent, or Firm* — Norton Rose Fulbright US LP (57) ABSTRACT

A method and system for near field localization includes providing at least one transmitting antenna and at least a first and second set of receiving antennas, the first and second set of receiving antennas provided at a known distance $R_{12}$ to each other and at a first radial distance $r_1$ and second radial distance $r_2$ from the transmitting antenna respectively. The first radial distance $r_1$ is determined relative to the magnetic field strength proportional to a RSSI measurement and a first subtended angle $\theta_1$. The second radial distance $r_2$ is determined relative to the magnetic field strength proportional to a RSSI measurement and a second subtended angle $\theta_2$. The theoretical magnetic field ratio dependent on $\theta_1$, $\theta_2$ and relative rotations $\theta_{2mod}$, $\theta_{1mod}$ respectively is then determined and either of $\theta_1$ and $\theta_2$ or $\theta_{1mod}$ and $\theta_{2mod}$; are solved and a set of solutions determined for the first subtended angle $\theta_1$ and second subtended angle $\theta_2$ which satisfies the orientation of the transmitting antenna thereby allowing determination of the direction of the transmitting antenna. For the set of solutions of the first subtended angle $\theta_1$ and second subtended angle $\theta_2$, the error between the RSSI and a theoretical magnetic field strength is minimized and one or more solutions that converge in response to movement of the transmitting antenna are selected.

8 Claims, 5 Drawing Sheets

(51) Int. Cl.
  *G01R 33/02*   (2006.01)
  *H04B 17/318*  (2015.01)
  *G01B 7/00*    (2006.01)
  *B60L 53/38*   (2019.01)

(58) Field of Classification Search
  USPC .......................................................... 701/408
  See application file for complete search history.

(56) References Cited

U.S. PATENT DOCUMENTS

2011/0315765 A1* 12/2011 Schantz ................ G01S 13/878
                                                                      235/385
2016/0316480 A1* 10/2016 Oh ........................ H04B 7/0695
2017/0074630 A1*  3/2017 Kotsonis ................... F42D 1/05

* cited by examiner

METHOD AND SYSTEM FOR NEAR-FIELD LOCALIZATION

RELATED APPLICATION INFORMATION

The present application claims priority to and the benefit of Australian Application No. 2017902021, which was filed in Australia on May 29, 2017, the disclosure which is incorporated herein by reference.

FIELD OF THE INVENTION

The present invention relates to a method and system for near field localization and in particular, a system and method for estimating the location of one or more receivers relative to one or more antennas.

BACKGROUND INFORMATION

Localization techniques are used in numerous applications where it is desired to know the position of one object relative to another. This may be, for example, a robot vacuum cleaner relative to a wall or table, or a mobile phone relative to a cell tower and the like.

Existing localization techniques include fingerprinting, angle of arrival and time of arrival amongst others. A problem with these arrangements is that they are most suitable in the far field region (e.g. two or more wavelengths) and may not be appropriate in the near field (e.g. less than one wavelength). Another problem with existing techniques is that even if a localization technique is applicable in the near field, the effectiveness of that localization technique depends on the application (such as robot vacuums, automatic parking, driverless systems, drones etc.) Different applications require different localization techniques.

It would therefore be desirable to provide a localization system and method which ameliorates or at least alleviates the above problems or provides alternatives.

Before turning to a summary of the present invention, it will be appreciated that the discussion of the background to the invention is included to explain the context of the invention. This is not to be taken as an admission that any of the material referred to is published, known or part of the common general knowledge.

SUMMARY OF THE INVENTION

According to a first aspect, the present invention provides a method of near field localization including:

(a) providing at least one transmitting antenna and at least a first and second set of receiving antennas, the first and second set of receiving antennas provided at a known distance $R_{12}$ to each other and at a first radial distance $r_1$ and second radial distance $r_2$ from the transmitting antenna respectively;

(b) determining the first radial distance $r_1$ relative to the magnetic field strength proportional to a RSSI measurement and a first subtended angle $\theta_1$;

(c) determining the second radial distance $r_2$ relative to the magnetic field strength proportional to a RSSI measurement and a second subtended angle $\theta_2$;

(d) determining the theoretical magnetic field ratio dependent on $\theta_1$, $\theta_2$ and relative rotations $\theta_{2mod}$, $\theta_{1mod}$ respectively;

(e) solving for one either of $\theta_1$ and $\theta_2$ or $\theta_{1mod}$ and $\theta_{2mod}$; and determining a set of solutions for the first subtended angle $\theta_1$ and second subtended angle $\theta_2$ which satisfies the orientation of the transmitting antenna thereby allowing determination of the direction of the transmitting antenna;

(f) for the set of solutions of the first subtended angle $\theta_1$ and second subtended angle $\theta_2$, minimising the error between the RSSI and a theoretical magnetic field strength; and (g) selecting the one or more solutions that converge in response to movement of the transmitting antenna.

Advantageously, the present invention utilises the magnetic field strength together with the law of sines to determine the orientation and location of the transmitting antenna. It is appreciated that the first radial distance $r_1$ and second radial distance $r_2$ are unknown.

Preferably, a model of the magnetic field at the first and second set of receiving antennas is provided, based on the receiving antennas being substantially perpendicular to each other, according to the formula:

$$H_{B1}^2(\theta_1, \theta_{2Mod}, r_1) = \qquad \text{(Equation 1)}$$
$$\frac{A}{4 \cdot r_1^6} \cdot \left( \cos^2(\theta_1) \cdot \sin^2(\theta_{2Mod}) + \frac{1}{4} \cdot \sin^2(\theta_1) \cdot \cos^2(\theta_{2Mod}) \right)$$

$$H_{A1}^2(\theta_1, \theta_{2Mod}, r_1) =$$
$$\frac{A}{4 \cdot r_1^6} \cdot \left( \cos^2(\theta_1) \cdot \cos^2(\theta_{2Mod}) + \frac{1}{4} \cdot \sin^2(\theta_1) \cdot \sin^2(\theta_{2Mod}) \right)$$

$$H_{B2}^2(\theta_2, \theta_{1Mod}, r_2) =$$
$$\frac{A}{4 \cdot r_2^6} \cdot \left( \cos^2(\theta_2) \cdot \sin^2(\theta_{1Mod}) + \frac{1}{4} \cdot \sin^2(\theta_2) \cdot \cos^2(\theta_{1Mod}) \right)$$

$$H_{A2}^2(\theta_2, \theta_{1Mod}, r_2) =$$
$$\frac{A}{4 \cdot r_2^6} \cdot \left( \cos^2(\theta_2) \cdot \cos^2(\theta_{1Mod}) + \frac{1}{4} \cdot \sin^2(\theta_2) \cdot \sin^2(\theta_{1Mod}) \right)$$

and the model of the magnetic field is solved for the first radial distance $r_1$ at steps (b) and (c). In an alternative $r_1$ may be solved as a function of $H_{A1}$ and $H_{B1}$.

The theoretical magnetic field strength equations above are based on the assumption that receiving antennas are substantially perpendicular to each other. In the case where the pickup coils are not substantially perpendicular, the magnetic fields now cannot be expressed with similar terms, that is the radial distances and subtended angle would remain the same where the $\theta_{1Mod_B}$ would have to be defined as a function $\theta_{1Mod_B}$:

$$H_{A2}^2(\theta_2, \theta_{1Mod}, r_2) = \frac{A}{4 \cdot r_2^6} \cdot \qquad \text{(Equation 2)}$$
$$\left( \cos^2(\theta_2) \cdot \cos^2(\theta_{1Mod_A}) + \frac{1}{4} \cdot \sin^2(\theta_2) \cdot \sin^2(\theta_{1Mod_B}) \right) =$$
$$\frac{A}{4 \cdot r_2^6} \cdot \left( \cos^2(\theta_2) \cdot \cos^2(\theta_{1Mod_A}) + \right.$$
$$\left. \frac{1}{4} \cdot \sin^2(\theta_2) \cdot \sin^2(\theta_{1Mod_A} + RotationalTerm) \right)$$

and then solving for the rotation using the ratio of magnetic fields is more complicated.

In the event all antennas are distant from each other, solving is further complicated in that it relies on a number of interdependencies (such as different radial distances, different subtended angles, all dependent on the rotation, and the like).

Preferably, the first and second sets of receiving antennas are at a distance from one another. In the case where first and second sets of receiving antennas in the same location, it is not possible to determine a solution. The wider the separation of the receiving antennas the better the localization. If all the antennas were all distant from each other, then equations would be required for all of the interdependencies.

Preferably, at step (e), $\theta_1$ and $\theta_2$ are solved simultaneously via the following steps:

(a) firstly eliminating the radial dependence by using the ratio of magnetic fields $$\frac{H_{A1}(\theta_1, \theta_{2mod}, r_1)^2}{H_{B1}(\theta_1, \theta_{2mod}, r_1)^2} = \frac{\cos(\theta_1)^2\cos(\theta_{2mod})^2 + \frac{1}{4}\sin(\theta_1)^2\sin(\theta_{2mod})^2}{\cos(\theta_1)^2\sin(\theta_{2mod})^2 + \frac{1}{4}\sin(\theta_1)^2\cos(\theta_{2mod})^2} \quad \text{(Equation 3)}$$

(b) solving for the second modulus angle $\theta_{2mod}$ to only be a function of the first subtended angle $\theta_1$ and a ratio of magnetic field strengths $$\theta_{2mod} = f\left(\theta_1, \frac{H_{A1}}{H_{B1}}\right) \quad \text{(Equation 4)}$$

and solving for the first modulus angle $\theta_{1mod}$ as a function of the second subtended angle $\theta_2$ and a ratio of magnetic field strengths, where:

$$\theta_{1mod} = f\left(\theta_2, \frac{H_{A2}}{H_{B2}}\right) \quad \text{(Equation 4)}$$

(c) using the relative magnetic field strength and respective subtended angles to correct for the invariance at 180 degrees of the pickup coils to accurately represent the geometry of the system;

(d) rearranging (Equation 1) and substituting (Equation 4) to thereby determine a function for the radial distances independent of $\theta_{2mod}$ and $\theta_{1mod}$, $$r_1^6(\theta_1, H_{A1}, H_{B1}) = \frac{A}{4 \cdot H_{B1}^2} \cdot \left(\cos^2(\theta_1) \cdot \sin^2\left(f\left(\theta_1, \frac{H_{A1}}{H_{B1}}\right)\right) + \frac{1}{4} \cdot \sin^2(\theta_1) \cdot \cos^2\left(f\left(\theta_1, \frac{H_{A1}}{H_{B1}}\right)\right)\right) \quad \text{(Equation 5)}$$

$$r_1^6(\theta_1, H_{B1}, H_{A1}) = \frac{A}{4 \cdot H_{A1}^2} \cdot \left(\cos^2(\theta_1) \cdot \cos^2\left(f\left(\theta_1, \frac{H_{A1}}{H_{B1}}\right)\right) + \frac{1}{4} \cdot \sin^2(\theta_1) \cdot \sin^2\left(f\left(\theta_1, \frac{H_{A1}}{H_{B1}}\right)\right)\right)$$

$$r_2^6(\theta_2, H_{A2}, H_{B2}) = \frac{A}{4 \cdot H_{B2}^2} \cdot \left(\cos^2(\theta_2) \cdot \sin^2\left(f\left(\theta_2, \frac{H_{A2}}{H_{B2}}\right)\right) + \frac{1}{4} \cdot \sin^2(\theta_2) \cdot \cos^2\left(f\left(\theta_2, \frac{H_{A2}}{H_{B2}}\right)\right)\right)$$

$$r_2^6(\theta_2, H_{B2}, H_{A2}) = \frac{A}{4 \cdot H_{A2}^2} \cdot \left(\cos^2(\theta_2) \cdot \cos^2\left(f\left(\theta_2, \frac{H_{A2}}{H_{B2}}\right)\right) + \frac{1}{4} \cdot \sin^2(\theta_2) \cdot \sin^2\left(f\left(\theta_2, \frac{H_{A2}}{H_{B2}}\right)\right)\right)$$

and;

(e) substituting the solutions for $\theta_{2mod}$, $\theta_{1mod}$, $r_1$ and $r_2$ into the following formula:

$$\frac{r_{12}}{\sin(\theta_2 - \theta_1)} = \frac{r_1(\theta_1, H_{A1}, H_{B1})}{\sin\left(f\left(\theta_2, \frac{H_{A2}}{H_{B2}}\right)\right)} = \frac{r_2(\theta_2, H_{A2}, H_{B2})}{\sin\left(f\left(\theta_2, \frac{H_{A2}}{H_{B2}}\right)\right)} \quad \text{(Equation 6)}$$

In an alternative, step (e) is solved simultaneously for $\theta_{1mod}$ and $\theta_{2mod}$ according to the steps:

(a) solving for the first subtended angle $\theta_1$ as a function of the second modulus angle $\theta_{2mod}$ and a ratio of magnetic field strengths, where:

$$\theta_1 = f\left(\theta_{2mod}, \frac{H_{A1}}{H_{B1}}\right) \quad \text{(Equation 7)}$$

And solving for the second subtended angle $\theta_2$ as a function of the first modulus angle $\theta_{2mod}$ and a ratio of magnetic field strengths, where:

$$\theta_2 = f\left(\theta_{1mod}, \frac{H_{A2}}{H_{B2}}\right) \quad \text{(Equation 7)}$$

(b) using the relative magnetic field strength and respective subtended angles to then correct for the invariance at 180 degrees of the pickup coils to accurately represent the geometry of the system;

(c) rearranging (Equation 1) and substituting (Equation 7) we can determine a function for the radial distances independent of $\theta_{2mod}$ and $\theta_{1mod}$, $$r_1^6(\theta_{2mod}, H_{A1}, H_{B1}) = \quad \text{(Equation 8)}$$
$$\frac{A}{4 \cdot H_{B1}^2} \cdot \left(\cos^2\left(f\left(\theta_{2mod}, \frac{H_{A1}}{H_{B1}}\right)\right) \cdot \sin^2(\theta_{2mod}) + \frac{1}{4} \cdot \sin^2\left(f\left(\theta_{2mod}, \frac{H_{A1}}{H_{B1}}\right)\right) \cdot \cos^2(\theta_{2mod})\right)$$

$$r_1^6(\theta_{2mod}, H_{B1}, H_{A1}) = \frac{A}{4 \cdot H_{A1}^2} \cdot$$
$$\left(\cos^2\left(f\left(\theta_{2mod}, \frac{H_{A1}}{H_{B1}}\right)\right) \cdot \cos^2(\theta_{2mod}) + \frac{1}{4} \cdot \sin^2\left(f\left(\theta_{2mod}, \frac{H_{A1}}{H_{B1}}\right)\right) \cdot \sin^2(\theta_{2mod})\right)$$

$$r_2^6(\theta_{1mod}, H_{A2}, H_{B2}) = \frac{A}{4 \cdot H_{A2}^2} \cdot$$
$$\left(\cos^2\left(f\left(\theta_{1mod}, \frac{H_{A2}}{H_{B2}}\right)\right) \cdot \sin^2(\theta_{1mod}) + \frac{1}{4} \cdot \sin^2\left(f\left(\theta_{1mod}, \frac{H_{A2}}{H_{B2}}\right)\right) \cdot \cos^2(\theta_{1mod})\right)$$

$$r_2^6(\theta_{1mod}, H_{B2}, H_{A2}) = \frac{A}{4 \cdot H_{A2}^2} \cdot$$
$$\left(\cos^2\left(f\left(\theta_{1mod}, \frac{H_{A2}}{H_{B2}}\right)\right) \cdot \cos^2(\theta_{1mod}) + \frac{1}{4} \cdot \sin^2\left(f\left(\theta_{1mod}, \frac{H_{A2}}{H_{B2}}\right)\right) \cdot \sin^2(\theta_{1mod})\right)$$

and;

(d) substituting the solutions for $\theta_2$, $\theta_1$, $r_1$ and $r_2$ into the following formula:

$$\frac{r_{12}}{\sin\left(f\left(\theta_{1mod}, \frac{H_{A2}}{H_{B2}}\right) - f\left(\theta_{2mod}, \frac{H_{A1}}{H_{B1}}\right)\right)} = \quad \text{(Equation 9)}$$

$$\frac{r_1(\theta_{2mod}, H_{A1}, H_{B1})}{\sin(\theta_{1mod})} = \frac{r_2(\theta_{1mod}, H_{A2}, H_{B2})}{\sin(\theta_{2mod})}$$

Preferably at step (f), minimising the error includes, minimising the error by determining the difference between measured RSSI value and theoretical magnetic field. In particular, the error is equal to the difference in the RSSI measured and calculated by using the subtended angles, $\theta_1$ and $\theta_2$ and rotation of the receivers, $\theta_{2mod}$ and $\theta_{1mod}$. That is, for each possible solution, take $\theta_1$, $\theta_2$, $\theta_{2mod}$ and $\theta_{1mod}$ (which already satisfy the geometry of the system) and calculate the error via the difference in each measured and predicted RSSI values (i.e. using Equation 1 above). It will be appreciated that the error could be calculated in any number of ways and that any suitable technique may be applied to minimise the error.

According to a second aspect, the present invention provides, a system for near-field localization including: at least one transmitting antenna; at least a first and second set of receiving antennas provided at a known distance $r_{12}$ to each other; the first and second set of receiving antennas each including two or more antennas which are non-parallel to each other; the first set of receiving antennas having a first radial distance $r_1$ from the transmitting antenna, a first subtended angle $\theta_1$ from the transmitting antenna and a first modulus angle, $\theta_{1mod}$; the second set having a second radial distance $r_2$ from the transmitting antenna, a second subtended angle $\theta_2$ from the transmitting antenna and a second modulus angle, $\theta_{2mod}$; a control unit for:

(a) determining the first radial distance $r_1$ relative to the magnetic field strength proportional to a RSSI measurement and a first subtended angle $\theta_1$;

(b) determining the second radial distance $r_2$ relative to the magnetic field strength proportional to a RSSI measurement and a second subtended angle $\theta_2$;

(c) determining the theoretical magnetic field ratio dependent on $\theta_1$, $\theta_2$ and relative rotations $\theta_{2mod}$ $\theta_{1mod}$ respectively;

(d) solving for either of $\theta_1$ and $\theta_2$ or $\theta_{1mod}$ and $\theta_{2mod}$; and determining a set of solutions for the first subtended angle $\theta_1$ and second subtended angle $\theta_2$ which satisfies the orientation of the transmitting antenna thereby allowing determination of the direction of the transmitting antenna;

(e) for the set of solutions of the first subtended angle $\theta_1$ and second subtended angle $\theta_2$, minimising the error between the RSSI and a theoretical magnetic field strength; and (f) selecting the one or more solutions that converge in response to movement of the transmitting antenna.

DETAILED DESCRIPTION

Figure 1:
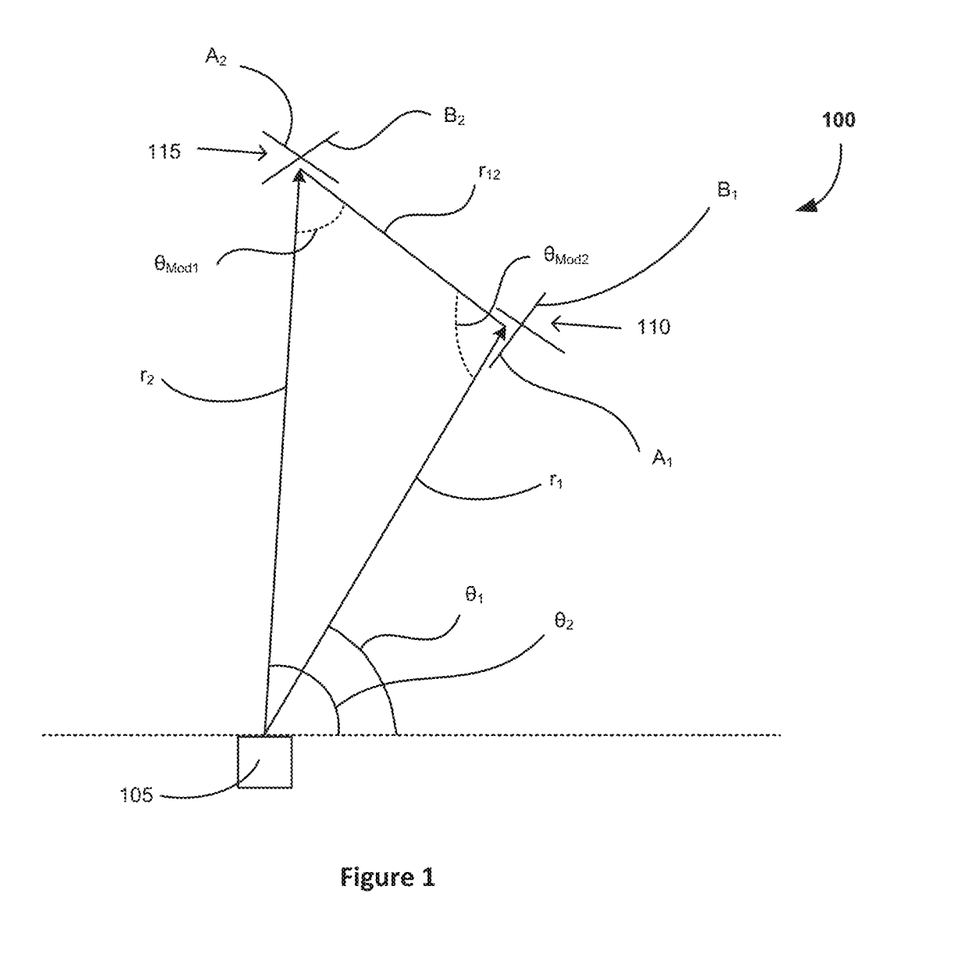
FIG. 1 is a schematic diagram illustrating the method and system of the present invention.

FIG. 1 illustrates a schematic diagram 100 of the application of the system and method of the present invention. At least one transmitting antenna 105 is provided together with a first set of receiving antennas 110 and a second set of receiving antennas 115. It will be appreciated that any number of sets of receiving antennas may be provided. It will also be appreciated that the receiving antennas need not be in the same location. For example when the receiving antennas are all distant from each other, cross coupling is reduced and in turn the uncertainty and in turn there is an improvement in accuracy. This impact is that the sine rule now is not based off one triangle but six that all need to be solved with interdependence and simultaneously, hence why there are improvements in accuracy. The present invention could be used in any application that may require higher accuracy localization. The present invention provides localization to determine the location of the antennas 110-115 with respect to the transmitting antenna 105. This may be applied in any number of applications such as, for example in case of autonomous driving, autonomous parking, robot vacuum cleaners, robot lawnmowers, toys, drones and the like.

The present invention will be described with reference to the transmitting antenna located in a vehicle and the set of receiving antennas 110 and 115 located at a docking station, but it will be appreciated that the present invention is not limited to these applications.

The transmitting antenna 105 is provided at an unknown first radial distance ri from the receiving antenna 110 and second unknown radial distance r2 from the second receiving antenna 115. Receiving antennas 110-115 are provided at a distance $r_{12}$ which is a known distance between the two sets of receiving antennas. The distance is known because in most applications the two sets of receiving antennas are provided in a fixed location (or movable between one or more locations but the distance between the possible locations being known). Each of the first and second receiving antennas 110-115 include a set of non-parallel antennas $A_1$-$B_1$ and $A_2$-$B_2$ respectively, that is to provide a sets of non-parallel receiving antennas.

Also provided is a first subtended angle $\theta_1$ from the transmitting antenna 105 and a second subtended angle $\theta_2$ from the transmitting antenna 105. Also provided are first modulus angle $\theta_{1mod}$ and second modulus angle $\theta_{2mod}$.

The present invention operates in the near field magnetic distribution, that is to say that is non-spherical and multi component. Given the non-symmetrical radial and angular components of the magnetic field distribution it is not immediately possible to determine the location of the transmitting antenna since there will be multiple solutions for where the transmitting antenna might be located.

The present invention utilises the magnetic field strength together with the law of sines to determine the orientation and location of the transmitting antenna 105. The sensitivity of each non-parallel receiving antenna $A_1$-$B_1$, $A_2$-$B_2$ of the first and second receiving antennas 110-115 respectively is dependent, the subtended angles $\theta_1$-$\theta_2$ and the orientation of the dock $\theta_{1mod}$ and $\theta_{2mod}$. The sensitivity of the receiving antennas is dependent on the subtended angle and rotation, whereas the magnitude is dependent on the radial distance. So the sensitivity of $A_1$-$B_1$ is dependent on $\theta_1$ and $\theta_{2mod}$ and in addition $A_2$-$B_2$ is dependent on $\theta_2$ and $\theta_{1mod}$ or the sensitivity of the receiving antennas is dependent on the subtended angle to the bisector of the dock and relative rotation of the dock. The reason for this is that there is interaction between the radial and angular components of the magnetic field distribution interacting with the receiving antennas. For example, in certain orientations the received signal strength indicator (RSSI), i.e. power present in a received signal (theoretically) may be zero or close to zero due to the presence of noise.

Using the relative RSSI values of the receiving antennas 110-115 it is possible to provide a model of the magnetic field at the first and second set of receiving antennas based on the receiving antennas being substantially perpendicular to each other, according to the formula:

$$H_{B1}^2(\theta_1, \theta_{2Mod}, r_1) = \qquad \text{(Equation 1)}$$
$$\frac{A}{4 \cdot r_1^6} \cdot \left( \cos^2(\theta_1) \cdot \sin^2(\theta_{2Mod}) + \frac{1}{4} \cdot \sin^2(\theta_1) \cdot \cos^2(\theta_{2Mod}) \right)$$

$$H_{A1}^2(\theta_1, \theta_{2Mod}, r_1) =$$
$$\frac{A}{4 \cdot r_1^6} \cdot \left( \cos^2(\theta_1) \cdot \cos^2(\theta_{2Mod}) + \frac{1}{4} \cdot \sin^2(\theta_1) \cdot \sin^2(\theta_{2Mod}) \right)$$

$$H_{B2}^2(\theta_2, \theta_{1Mod}, r_2) =$$
$$\frac{A}{4 \cdot r_2^6} \cdot \left( \cos^2(\theta_2) \cdot \sin^2(\theta_{1Mod}) + \frac{1}{4} \cdot \sin^2(\theta_2) \cdot \cos^2(\theta_{1Mod}) \right)$$

$$H_{A2}^2(\theta_2, \theta_{1Mod}, r_2) =$$
$$\frac{A}{4 \cdot r_2^6} \cdot \left( \cos^2(\theta_2) \cdot \cos^2(\theta_{1Mod}) + \frac{1}{4} \cdot \sin^2(\theta_2) \cdot \sin^2(\theta_{1Mod}) \right)$$

The model of the magnetic field is then solved for the first radial distance $r_1$. In an alternative r1 may be solved as a function of $H_{A1}$ and $H_{B1}$.

Preferably, $\theta_1$ and $\theta_2$ are solved simultaneously via the following steps:

(a) firstly eliminating the radial dependence by using the ratio of magnetic fields $$\frac{H_{A1}(\theta_1, \theta_{2mod}, r_1)^2}{H_{B1}(\theta_1, \theta_{2mod}, r_1)^2} = \qquad \text{(Equation 3)}$$
$$\frac{\cos(\theta_1)^2 \cos(\theta_{2mod})^2 + \frac{1}{4}\sin(\theta_1)^2 \sin(\theta_{2mod})^2}{\cos(\theta_1)^2 \sin(\theta_{2mod})^2 + \frac{1}{4}\sin(\theta_1)^2 \cos(\theta_{2mod})^2}$$

(b) solving for the second modulus angle $\theta_{2mod}$ to only be a function of the first subtended angle $\theta_1$ and a ratio of magnetic field strengths $$\theta_{2mod} = f\left(\theta_1, \frac{H_{A1}}{H_{B1}}\right) \qquad \text{(Equation 4)}$$

and solving for the first modulus angle $\theta_{1mod}$ as a function of the second subtended angle $\theta_2$ and a ratio of magnetic field strengths, where:

$$\theta_{1mod} = f\left(\theta_2, \frac{H_{A2}}{H_{B2}}\right) \qquad \text{(Equation 4)}$$

(c) using the relative magnetic field strength and respective subtended angles to correct for the invariance at 180 degrees of the pickup coils thereby accurately representing the geometry of the system; and (d) rearranging (Equation 1) and substituting (Equation 4) we can determine a function for the radial distances independent of $\theta_{2mod}$ and $\theta_{1mod}$.

$$r_1^6(\theta_1, H_{A1}, H_{B1}) = \frac{A}{4 \cdot H_{B1}^2} \cdot \left( \cos^2(\theta_1) \cdot \sin^2\left(f\left(\theta_1, \frac{H_{A1}}{H_{B1}}\right)\right) + \right. \qquad \text{(Equation 5)}$$
$$\left. \frac{1}{4} \cdot \sin^2(\theta_1) \cdot \cos^2\left(f\left(\theta_1, \frac{H_{A1}}{H_{B1}}\right)\right) \right)$$

$$r_1^6(\theta_1, H_{B1}, H_{A1}) = \frac{A}{4 \cdot H_{A1}^2} \cdot \left( \cos^2(\theta_1) \cdot \cos^2\left(f\left(\theta_1, \frac{H_{A1}}{H_{B1}}\right)\right) + \right.$$
$$\left. \frac{1}{4} \cdot \sin^2(\theta_1) \cdot \sin^2\left(f\left(\theta_1, \frac{H_{A1}}{H_{B1}}\right)\right) \right)$$

$$r_2^6(\theta_2, H_{A2}, H_{B2}) = \frac{A}{4 \cdot H_{B2}^2} \cdot \left( \cos^2(\theta_2) \cdot \sin^2\left(f\left(\theta_2, \frac{H_{A2}}{H_{B2}}\right)\right) + \right.$$
$$\left. \frac{1}{4} \cdot \sin^2(\theta_2) \cdot \cos^2\left(f\left(\theta_2, \frac{H_{A2}}{H_{B2}}\right)\right) \right)$$

$$r_2^6(\theta_2, H_{B2}, H_{A2}) = \frac{A}{4 \cdot H_{A2}^2} \cdot \left( \cos^2(\theta_2) \cdot \cos^2\left(f\left(\theta_2, \frac{H_{A2}}{H_{B2}}\right)\right) + \right.$$
$$\left. \frac{1}{4} \cdot \sin^2(\theta_2) \cdot \sin^2\left(f\left(\theta_2, \frac{H_{A2}}{H_{B2}}\right)\right) \right)$$

and;

(e) substituting the solutions for $\theta_{2mod}$, $\theta_{1mod}$, $r_1$ and $r_2$ into the following formula:

$$\frac{r_{12}}{\sin(\theta_2 - \theta_1)} = \frac{r_1(\theta_1, H_{A1}, H_{B1})}{\sin\left(f\left(\theta_2, \frac{H_{A2}}{H_{B2}}\right)\right)} = \frac{r_2(\theta_2, H_{A2}, H_{B2})}{\sin\left(f\left(\theta_2, \frac{H_{A2}}{H_{B2}}\right)\right)} \qquad \text{(Equation 6)}$$

In an alternative, $\theta_{1mod}$ and $\theta_{2mod}$ are solved for simultaneously according to the steps:

(a) solving for the first subtended angle $\theta_1$ as a function of the second modulus angle $\theta_{2mod}$ and a ratio of magnetic field strengths, where:

$$\theta_1 = f\left(\theta_{2mod}, \frac{H_{A1}}{H_{B1}}\right) \qquad \text{(Equation 7)}$$

and solving for the second subtended angle $\theta_2$ as a function of the first modulus angle $\theta_{2mod}$ and a ratio of magnetic field strengths, where:

$$\theta_2 = f\left(\theta_{1mod}, \frac{H_{A2}}{H_{B2}}\right) \qquad \text{(Equation 7)}$$

(b) using the relative magnetic field strength and respective subtended angles it is possible to then correct for the invariance at 180 degrees of the pickup coils to accurately represent the geometry of the system;

(c) rearranging equation 1 and substituting equation 7 we can determine a function for the radial distances independent of $\theta_{2mod}$ and $\theta_{1mod}$, $$r_1^6(\theta_{2mod}, H_{A1}, H_{B1}) = \quad \text{(Equation 8)}$$

$$\frac{A}{4 \cdot H_{B1}^2} \cdot \left( \cos^2\left(f\left(\theta_{2mod}, \frac{H_{A1}}{H_{B1}}\right)\right) \cdot \sin^2(\theta_{2mod}) + \right.$$

$$\left. \frac{1}{4} \cdot \sin^2\left(f\left(\theta_{2mod}, \frac{H_{A1}}{H_{B1}}\right)\right) \cdot \cos^2(\theta_{2mod}) \right)$$

$$r_1^6(\theta_{2mod}, H_{B1}, H_{A1}) = \frac{A}{4 \cdot H_{A1}^2} \cdot$$

$$\left( \cos^2\left(f\left(\theta_{2mod}, \frac{H_{A1}}{H_{B1}}\right)\right) \cdot \cos^2(\theta_{2mod}) + \right.$$

$$\left. \frac{1}{4} \cdot \sin^2\left(f\left(\theta_{2mod}, \frac{H_{A1}}{H_{B1}}\right)\right) \cdot \sin^2(\theta_{2mod}) \right)$$

$$r_2^6(\theta_{1mod}, H_{A2}, H_{B2}) = \frac{A}{4 \cdot H_{B2}^2} \cdot$$

$$\left( \cos^2\left(f\left(\theta_{1mod}, \frac{H_{A2}}{H_{B2}}\right)\right) \cdot \sin^2(\theta_{1mod}) + \right.$$

$$\left. \frac{1}{4} \cdot \sin^2\left(f\left(\theta_{1mod}, \frac{H_{A2}}{H_{B2}}\right)\right) \cdot \cos^2(\theta_{1mod}) \right)$$

$$r_2^6(\theta_{1mod}, H_{B2}, H_{A2}) = \frac{A}{4 \cdot H_{A2}^2} \cdot$$

$$\left( \cos^2\left(f\left(\theta_{1mod}, \frac{H_{A2}}{H_{B2}}\right)\right) \cdot \cos^2(\theta_{1mod}) + \right.$$

$$\left. \frac{1}{4} \cdot \sin^2\left(f\left(\theta_{1mod}, \frac{H_{A2}}{H_{B2}}\right)\right) \cdot \sin^2(\theta_{1mod}) \right)$$

and;
(d) substituting the solutions for $\theta_2$, $\theta_1$, $r_1$ and $r_2$ into the following formula:

$$\frac{r_{12}}{\sin\left(f\left(\theta_{1mod}, \frac{H_{A2}}{H_{B2}}\right) - f\left(\theta_{2mod}, \frac{H_{A1}}{H_{B1}}\right)\right)} = \quad \text{(Equation 9)}$$

$$\frac{r_1(\theta_{2mod}, H_{A1}, H_{B1})}{\sin(\theta_{1mod})} = \frac{r_2(\theta_{1mod}, H_{A2}, H_{B2})}{\sin(\theta_{2mod})}$$

From these equations and using the sine rule it is possible to link all of the angles between the transmitting antenna 105 and receiving antennas 110-115 together to find a set of possible solutions for $\theta_1$ and $\theta_2$ that satisfies the ratio of magnetic fields for both sets of non-parallel antennas $A_1$-$B_1$, $A_2$-$B_2$.

A problem may be encountered because the receiving coils are invariant at 180° and at this point the orientation cannot be fully determined. In order to determine it, a ratio for each of $A_1$-$B_1$, $A_2$-$B_2$ is provided for the orthogonal magnetic field strengths as a function of $\theta_1$ and $\theta_{2mod}$. In an additional step, the predicted rotation may include two possibilities which can be determined dependent on the opposite pickup coils relative RSSI values.

Figure 2:
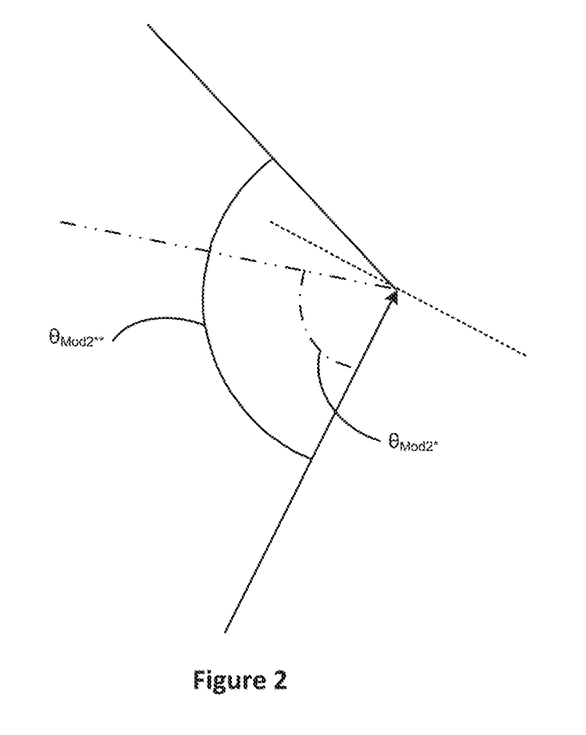
FIG. 2 is a schematic diagram illustrating the first and second modulus angles.

As shown in FIG. 2 by linking the dual set of non-parallel antennas 110-115 separated at a known distance $r_1$-$r_2$ it is possible to determine a set of solutions for the subtended angles $\theta_1$ and $\theta_2$ which satisfies the orientation of the transmitting antenna 105. It will be appreciated that the determined orientation will be the modulus 90° solution of all cases. The corrected orientation as shown in FIG. 2 is dependent on the relative set of $r_1$-$r_2$ at $\theta_1$ and $\theta_2$ respectively with respect to $r_1$-$r_2$.

Figure 3:
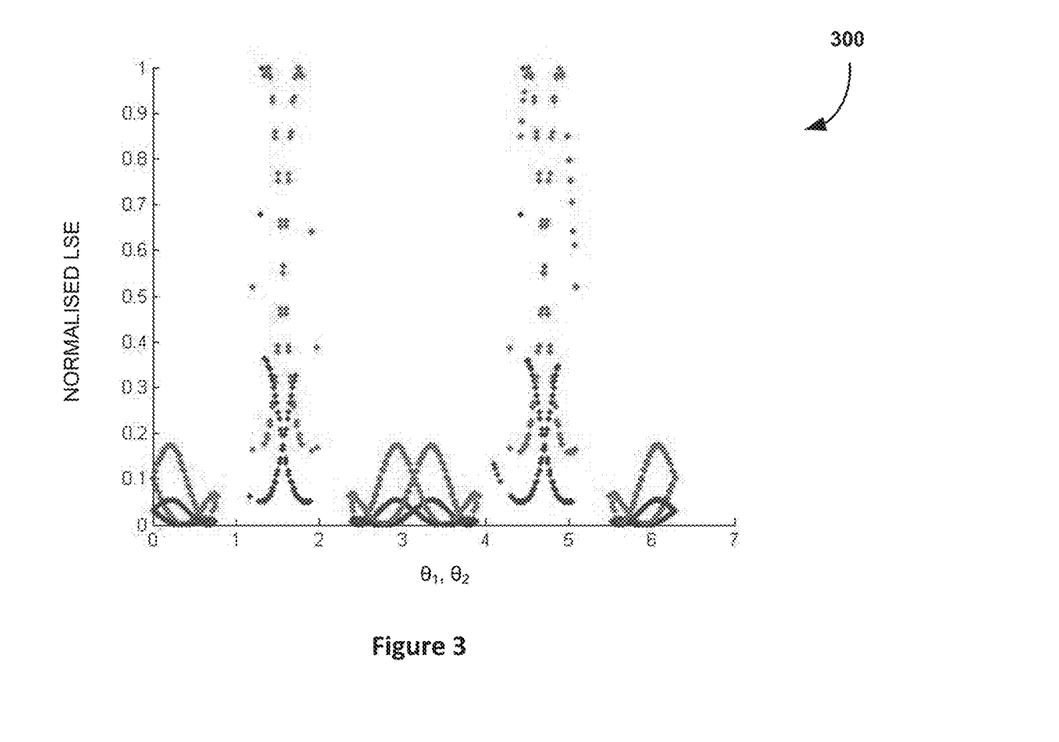
FIG. 3 is a graph illustrating a least squared approach to determining a set of solutions for both first and second subtended angles.

As shown in FIG. 3, the graph illustrates a least squared approach to determining a set of solutions for both first and second subtended angles. As shown, correction of the orientation of the transmitting antenna 105 the solutions for at $\theta_1$ and $\theta_2$ are minimized via a squared error between the RSSI value and the theoretical magnetic field strengths. As shown, there may be more than one solution. It will be appreciated that many iterative solving techniques could be used to arrive at a solution.

Figures 6A, 6B, 6C:
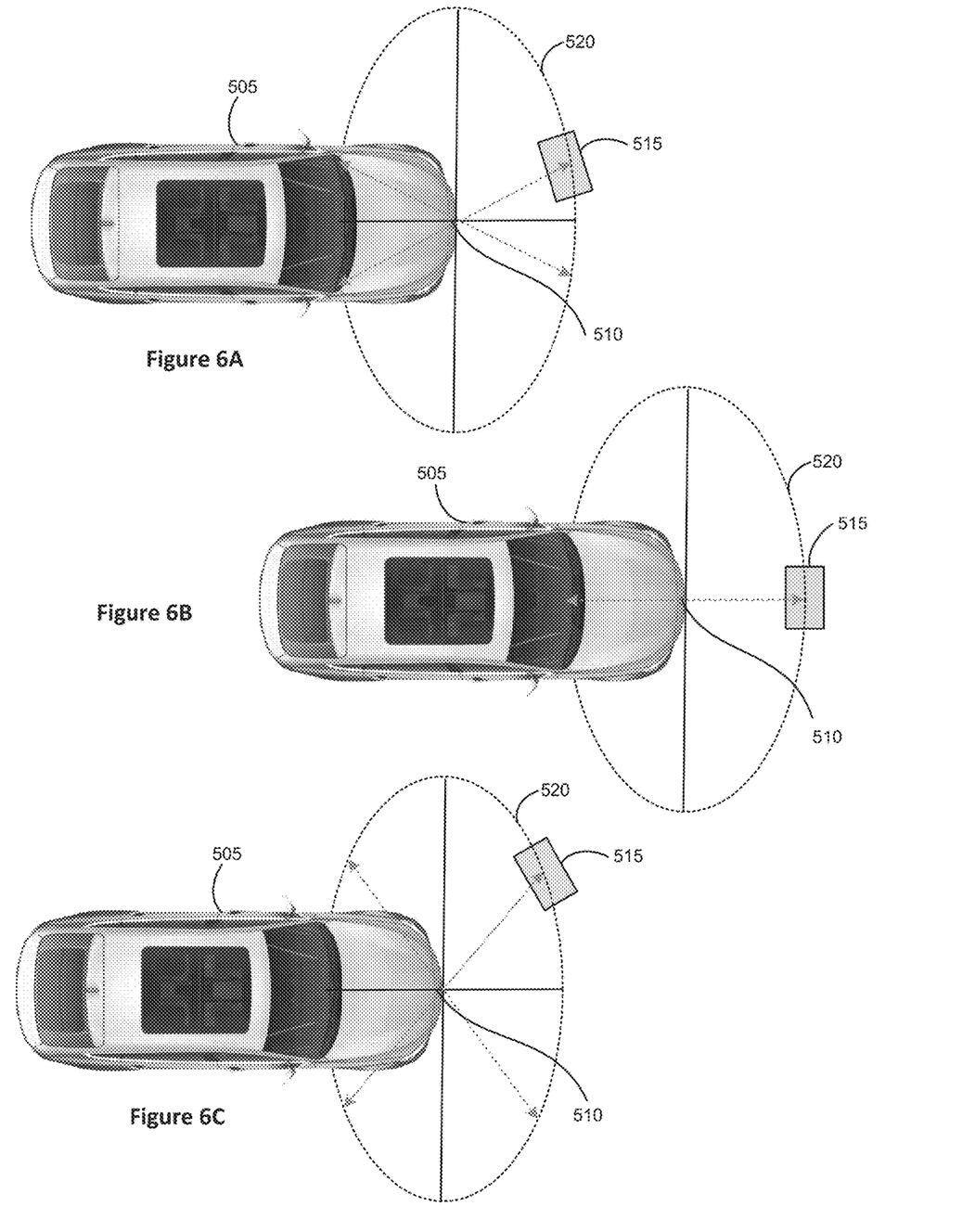
FIG. 6A to 6C illustrates converging towards a set of solutions.

Since there is an invariance of the orientation of each antenna 105, 110-115 the set of solutions cannot be solved completely which leads to a polymorphous solution. So for each iteration there are four possible solutions. As will be described further with reference to FIG. 6, the possible set of solutions can be reduced by approaching the transmitting antenna 105 and depending on where the antennas 110-115 are relative to the transmitting antenna 105 (i.e. closer or further away) this will determine whether or not the solutions converge and whether or not a particular solution is correct or incorrect.

Figure 4:
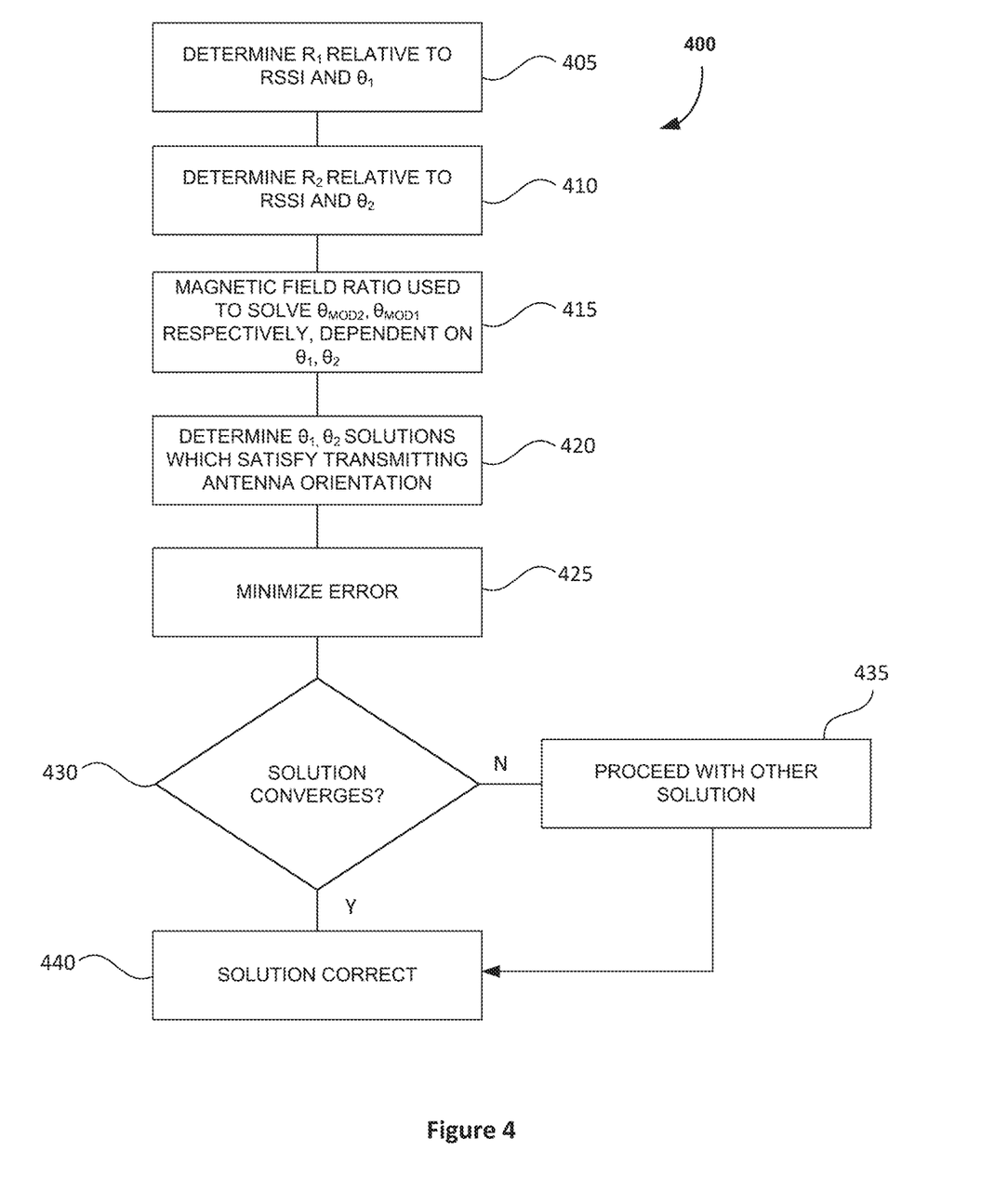
FIG. 4 is a flow diagram illustrating the method of the present invention.

FIG. 4 is a schematic diagram illustrating the method 400 of the invention for near field localization of at least a first and second set of receiving antennas 110-115 relative to at least one transmitting antenna 105 where the first and second set of receiving antennas are provided at known distance $r_1$-$r_2$ to each other and at first radial distance ri and a second radial distance $r_2$ from the transmitting antenna 105 respectively. At step 405 the set of radial distance $r_1$ relative to the magnetic field strength proportional to a RSSI measurement and a subtended angle $\theta_1$ is determined. Control then moves to step 410 where the second set of radial distance $r_2$ relative to the magnetic field strength proportional to a RSSI measurement and a second subtended angle $\theta_2$ is determined. Control then moves to step 415 where the theoretical magnetic field ratio dependent on $\theta_1$, $\theta_2$ and relative rotations $\theta_{2mod}$, $\theta_{1mod}$ respectively is determined.

Control then moves to step 420 where either of $\theta_1$ and $\theta_2$ or $\theta_{1mod}$ and $\theta_{2mod}$; are solved for and a set of solutions determined for the first subtended angle $\theta_1$ and second subtended angle $\theta_2$ which satisfies the orientation of the transmitting antenna thereby allowing determination of the direction of the transmitting antenna. In this step, a number of solutions is determined and since a number of possible solutions are provided, control moves to step 425 where for the set of solutions determined at step 420 (of the first subtended angle $\theta_1$ and second subtended angle $\theta_2$) the error between the measured and theoretical RSSI is minimized.

The error minimisation may be carried out in any fashion and for example may include least squares, least absolute method and the like.

Control then moves to step 430 where, in response to movement of the transmitting antenna 105 relative to the receiving antennas 110 and 115, it is determined whether or not the minimized error solution determined at step 425 is closer (e.g. if the solution in the order of 90 degrees). In the event that in the response to the movement the solution converges, control moves to step 440 where the solution is selected. Alternatively, in the event the solution does not converge, control moves to step 435 where it is then determined that the other solution is more appropriate and control moves to step 440.

Figure 5:
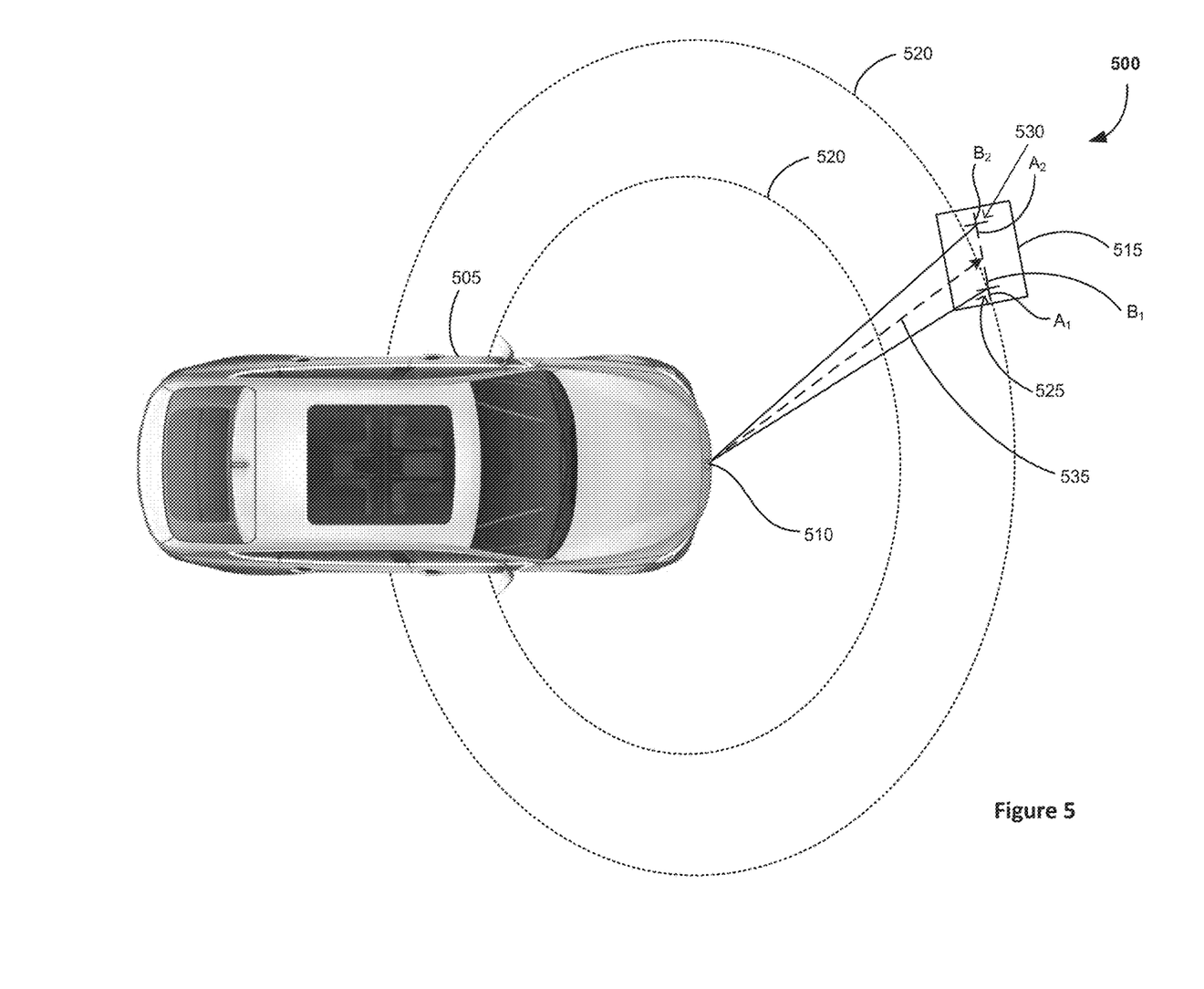
FIG. 5 is a schematic diagram of the system and method of the present invention applied to a docking station for a motor vehicle.

FIG. 5 is a schematic diagram 500 of the application of the present invention in the context of a motor vehicle 505 connecting to a wireless powered transfer dock 515 by way of near field linked lateration of magnetic field 520. The vehicle 505 includes a transmitter 510 which may be located in a convenient location in the motor vehicle and the wireless transfer dock 515. The transmitter 510 could be located at any position, provided its relative position with respect to the transmitting antenna is known. The motor vehicle 505 needs to navigate to the wireless powered transfer dock 515 in order to charge a battery for example. It will be appreciated that this is an example of an embodiment in which the invention may be carried out but the invention is not limited to this application and in fact the present invention may be provided in any number of context of in which near field magnetic fields are provided for example, robot vacuums, automatic parking, driverless systems, drones and the like.

As described with reference to FIG. 1, the wireless powered transfer dock 515 includes two sets of receiving antennas 525 and 530 each of which have non-parallel antennas $A_1$-$B_1$, $A_2$-$B_2$ respectively. From the method and system of the present invention we are able to determine a predicted vector to the object where the line 535 is the predicted vector from the wireless powered transfer dock 515 to the transmitting antenna 510. Advantageously using the electromagnetic field distribution (near field) which is non spherical and multi-component, relative RSSI measurements in the receiving antennas are used to determine the relative position of the transmitting antenna 510 with respect to the known positions of the receiving antennas 525-530. Localization relies on the sensitivity of the sets of receiving antennas 525 and 530 which is used to effectively determine the rotation of the wireless powered transfer dock 515 with respect to the transmitting antenna 510.

The angular information is then used to determine a set of solutions which satisfy the relative dimensions of the system using the magnitude of the RSSI values to determine the relative radial distances to each antenna 525-530 using the distance between them (which is known). The set of solutions is then further minimized using least squared error minimisation, least absolute method or the like.

Given the known orientation of the antennas with respect to the ground plane, this enables the solution to be in variant of the orientation with respect to the transmitting antenna 510. Advantageously, the system is fully flexible with regard to the distance between the sets of antennas 525-530 which allows for flexibility in product needs (i.e. beyond simply docking a vehicle to a wireless powered transfer dock). It will be appreciated that the system and method of the present invention may run within a control unit (such as an engine computer) in the vehicle 505.

FIGS. 6A, 6B and 6C illustrate in a practical sense once the solutions have been determined and the errors minimized, which of the solutions is actually the correct solution. For example, there may be four solutions to the location of the transmitting antenna 510 and for example in FIG. 6A the distance and orientation of the wireless power transfer dock 515 relative to the transmitting antenna 510 is known but as shown in FIG. 6B only when moving the transmitting antenna 510 in a direction does the solution converge. In contrast, wireless power transfer dock 515 diverges as shown in FIG. 6C. By knowing whether the solution converges or diverges allows to determine which solution is correct and selects the correct solution and then track and dock the vehicle 505 accurately.

Advantageously, because the direction of a transmitting antenna relative to the receiving antennas is known after two iterations of the method and system of the present invention, this can be extended provide automatic vehicle parking and the like. Advantageously, using existing hardware such a low frequency antenna allows drivers for quick and inexpensive development while maintaining security. The method and system of the present invention allows for route mapping, range calibration and speed approaches with improved speed and reduced complexity. Using a low frequency also offers flexibility in positioning of the dock 515 since low frequency has low impact on external objects and not requiring the area at which the dock 515 resides to be fully controlled. Advantageously, the present invention is versatile for both docking stations 515 and vehicles 505 in that there is no fixed delta or location requirements for the transmitting antenna 525-530 which is provided in or on the vehicle 505 and no fixed $r_1$, $r_2$ values between the receiving antennas. In this scenario, there is no requirement for the height of the transmitting antenna and the receiving antennas to be known in order for the system and method of the present invention to work. This can be corrected for since the orientation (parallel to the ground) will be known.

What is claimed is:

1. A method of near field localization including:
   (a) providing at least one transmitting antenna and at least a first and second set of receiving antennas, the first and second set of receiving antennas provided at a known distance $r_{12}$ to each other and at a first radial distance $r_1$ and second radial distance $r_2$ from the transmitting antenna respectively;
   (b) determining the first radial distance $r_1$ relative to the magnetic field strength proportional to a RSSI measurement and a first subtended angle $\theta_1$;
   (c) determining the second radial distance $r_2$ relative to the magnetic field strength proportional to a RSSI measurement and a second subtended angle $\theta_2$;
   (d) determining the theoretical magnetic field ratio dependent on $\theta_1$, $\theta_2$ and relative rotations $\theta_{2mod}$, $\theta_{1mod}$ respectively;
   (e) solving for either of $\theta_1$ and $\theta_2$ or $\theta_{1mod}$ and $\theta_{2mod}$; and determining a set of solutions for the first subtended angle $\theta_1$ and second subtended angle $\theta_2$ which satisfies the orientation of the transmitting antenna thereby allowing determination of the direction of the transmitting antenna;
   (f) for the set of solutions of the first subtended angle $\theta_1$ and second subtended angle $\theta_2$, minimising the error between the RSSI and a theoretical magnetic field strength; and
   (g) selecting the one or more solutions that converge in response to movement of the transmitting antenna.

2. The method of claim 1, wherein at step (a) a model of the magnetic field at the first and second set of receiving antennas is provided, based on the receiving antennas being substantially perpendicular to each other, according to the formula:

$$H_{B1}^2(\theta_1, \theta_{2Mod}, r_1) = \frac{A}{4 \cdot r_1^6} \cdot \left( \cos^2(\theta_1) \cdot \sin^2(\theta_{2Mod}) + \frac{1}{4} \cdot \sin^2(\theta_1) \cdot \cos^2(\theta_{2Mod}) \right)$$

$$H_{A1}^2(\theta_1, \theta_{2Mod}, r_1) = \frac{A}{4 \cdot r_1^6} \cdot \left( \cos^2(\theta_1) \cdot \cos^2(\theta_{2Mod}) + \frac{1}{4} \cdot \sin^2(\theta_1) \cdot \sin^2(\theta_{2Mod}) \right)$$

$$H_{B2}^2(\theta_2, \theta_{1Mod}, r_2) = \frac{A}{4 \cdot r_2^6} \cdot \left( \cos^2(\theta_2) \cdot \sin^2(\theta_{1Mod}) + \frac{1}{4} \cdot \sin^2(\theta_2) \cdot \cos^2(\theta_{1Mod}) \right)$$

$$H_{A2}^2(\theta_2, \theta_{1Mod}, r_2) = \frac{A}{4 \cdot r_2^6} \cdot \left( \cos^2(\theta_2) \cdot \cos^2(\theta_{1Mod}) + \frac{1}{4} \cdot \sin^2(\theta_2) \cdot \sin^2(\theta_{1Mod}) \right)$$

(Equation 1)

and the model of the magnetic field is solved for the first radial distance $r_1$ at steps (b) and (c).

3. The method of claim 2, wherein $r_1$ is solved as a function of $H_{A1}$ and $H_{B1}$.

4. The method of claim 1, wherein the first and second sets of receiving antennas are distant from one another.

5. The method of claim 1 wherein, at step (e), $\theta_1$ and $\theta_2$ are solved simultaneously via the following steps:

(a) eliminating the radial dependence by using the ratio of magnetic fields $$\frac{H_{A1}(\theta_1, \theta_{2mod}, r_1)^2}{H_{B1}(\theta_1, \theta_{2mod}, r_1)^2} = \frac{\cos(\theta_1)^2 \cos(\theta_{2mod})^2 + \frac{1}{4}\sin(\theta_1)^2 \sin(\theta_{2mod})^2}{\cos(\theta_1)^2 \sin(\theta_{2mod})^2 + \frac{1}{4}\sin(\theta_1)^2 \cos(\theta_{2mod})^2} \quad \text{(Equation 3)}$$

(b) solving for the second modulus angle $\theta_{2mod}$ to only be a function of the first subtended angle $\theta_1$ and a ratio of magnetic field strengths $$\theta_{2mod} = f\left(\theta_1, \frac{H_{A1}}{H_{B1}}\right) \quad \text{(Equation 4)}$$

and solving for the first modulus angle $\theta_{1mod}$ as a function of the second subtended angle $\theta_2$ and a ratio of magnetic field strengths, where:

$$\theta_{1mod} = f\left(\theta_2, \frac{H_{A2}}{H_{B2}}\right); \quad \text{(Equation 4)}$$

(c) using the relative magnetic field strength and respective subtended angles to correct for the invariance at 180 degrees of the pickup coils thereby accurately representing the geometry of the system;

(d) rearranging (Equation 1) and substituting (Equation 4) to thereby determine a function for the radial distances independent of $\theta_{2mod}$ and $\theta_{1mod}$, $$r_1^6(\theta_1, H_{A1}, H_{B1}) = \frac{A}{4 \cdot H_{B1}^2} \cdot \left(\cos^2(\theta_1) \cdot \sin^2\left(f\left(\theta_1, \frac{H_{A1}}{H_{B1}}\right)\right) + \frac{1}{4} \cdot \sin^2(\theta_1) \cdot \cos^2\left(f\left(\theta_1, \frac{H_{A1}}{H_{B1}}\right)\right)\right) \quad \text{(Equation 5)}$$

$$r_1^6(\theta_1, H_{B1}, H_{A1}) = \frac{A}{4 \cdot H_{A1}^2} \cdot \left(\cos^2(\theta_1) \cdot \cos^2\left(f\left(\theta_1, \frac{H_{A1}}{H_{B1}}\right)\right) + \frac{1}{4} \cdot \sin^2(\theta_1) \cdot \sin^2\left(f\left(\theta_1, \frac{H_{A1}}{H_{B1}}\right)\right)\right)$$

$$r_2^6(\theta_2, H_{A2}, H_{B2}) = \frac{A}{4 \cdot H_{B2}^2} \cdot \left(\cos^2(\theta_2) \cdot \sin^2\left(f\left(\theta_2, \frac{H_{A2}}{H_{B2}}\right)\right) + \frac{1}{4} \cdot \sin^2(\theta_2) \cdot \cos^2\left(f\left(\theta_2, \frac{H_{A2}}{H_{B2}}\right)\right)\right)$$

$$r_2^6(\theta_2, H_{B2}, H_{A2}) = \frac{A}{4 \cdot H_{A2}^2} \cdot \left(\cos^2(\theta_2) \cdot \cos^2\left(f\left(\theta_2, \frac{H_{A2}}{H_{B2}}\right)\right) + \frac{1}{4} \cdot \sin^2(\theta_2) \cdot \sin^2\left(f\left(\theta_2, \frac{H_{A2}}{H_{B2}}\right)\right)\right)$$

and;

(e) substituting the solutions for $\theta_{2mod}$, $\theta_{1mod}$ $r_1$ and $r_2$ into the following formula:

$$\frac{r_{12}}{\sin(\theta_2 - \theta_1)} = \frac{r_1(\theta_1, H_{A1}, H_{B1})}{\sin\left(f\left(\theta_2, \frac{H_{A2}}{H_{B2}}\right)\right)} = \frac{r_2(\theta_2, H_{A2}, H_{B2})}{\sin\left(f\left(\theta_2, \frac{H_{A2}}{H_{B2}}\right)\right)} \quad \text{(Equation 6)}$$

6. The method of claim 5 wherein step, (e) is solved simultaneously for $\theta_{1mod}$ and $\theta_{2mod}$ according to the steps:

(a) solving for the first subtended angle $\theta_1$ as a function of the second modulus angle $\theta_{2mod}$ and a ratio of magnetic field strengths, where:

$$\theta_1 = f\left(\theta_{1mod}, \frac{H_{A1}}{H_{B1}}\right) \quad \text{(Equation 7)}$$

and solving for the second subtended angle $\theta_2$ as a function of the first modulus angle $\theta_{2mod}$ and a ratio of magnetic field strengths, where:

$$\theta_2 = f\left(\theta_{2mod}, \frac{H_{A2}}{H_{B2}}\right); \quad \text{(Equation 7)}$$

(b) using the relative magnetic field strength and respective subtended angles to then correct for the invariance at 180 degrees of the pickup coils to accurately represent the geometry of the system;

(c) rearranging (Equation 1) and substituting (Equation 7) and thereby determining a function for the radial distances independent of $\theta_{2mod}$ and $\theta_{1mod}$, $$r_1^6(\theta_{2mod}, H_{A1}, H_{B1}) = \quad \text{(Equation 8)}$$
$$\frac{A}{4 \cdot H_{B1}^2} \cdot \left(\cos^2\left(f\left(\theta_{2mod}, \frac{H_{A1}}{H_{B1}}\right)\right) \cdot \sin^2(\theta_{2mod}) + \frac{1}{4} \cdot \sin^2\left(f\left(\theta_{2mod}, \frac{H_{A1}}{H_{B1}}\right)\right) \cdot \cos^2(\theta_{2mod})\right)$$

$$r_1^6(\theta_{2mod}, H_{B1}, H_{A1}) = \frac{A}{4 \cdot H_{A1}^2} \cdot$$
$$\left(\cos^2\left(f\left(\theta_{2mod}, \frac{H_{A1}}{H_{B1}}\right)\right) \cdot \cos^2(\theta_{2mod}) + \frac{1}{4} \cdot \sin^2\left(f\left(\theta_{2mod}, \frac{H_{A1}}{H_{B1}}\right)\right) \cdot \sin^2(\theta_{2mod})\right)$$

$$r_2^6(\theta_{1mod}, H_{A2}, H_{B2}) = \frac{A}{4 \cdot H_{B2}^2} \cdot$$
$$\left(\cos^2\left(f\left(\theta_{1mod}, \frac{H_{A2}}{H_{B2}}\right)\right) \cdot \sin^2(\theta_{1mod}) + \frac{1}{4} \cdot \sin^2\left(f\left(\theta_{1mod}, \frac{H_{A2}}{H_{B2}}\right)\right) \cdot \cos^2(\theta_{1mod})\right)$$

$$r_2^6(\theta_{1mod}, H_{B2}, H_{A2}) = \frac{A}{4 \cdot H_{A2}^2} \cdot$$
$$\left(\cos^2\left(f\left(\theta_{1mod}, \frac{H_{A2}}{H_{B2}}\right)\right) \cdot \cos^2(\theta_{1mod}) + \frac{1}{4} \cdot \sin^2\left(f\left(\theta_{1mod}, \frac{H_{A2}}{H_{B2}}\right)\right) \cdot \sin^2(\theta_{1mod})\right)$$

and;

(d) substituting the solutions for $\theta_2$, $\theta_1$, $r_1$ and $r_2$ into the following formula:

$$\frac{r_{12}}{\sin\left(f\left(\theta_{1mod}, \frac{H_{A2}}{H_{B2}}\right) - f\left(\theta_{2mod}, \frac{H_{A1}}{H_{B1}}\right)\right)} = \quad \text{(Equation 9)}$$

$$\frac{r_1(\theta_{2mod}, H_{A1}, H_{B1})}{\sin(\theta_{1mod})} = \frac{r_2(\theta_{1mod}, H_{A2}, H_{B2})}{\sin(\theta_{2mod})}$$

7. The method of claim 1, wherein at step (f), minimising the error includes, minimising the error by determining the difference between measured RSSI value and theoretical magnetic field.

8. A system for near-field localization includes: at least one transmitting antenna; at least a first and second set of receiving antennas provided at a known distance $r_{12}$ to each other; the first and second set of receiving antennas each including two or more antennas which are non-parallel to each other; the first set of receiving antennas having a first radial distance $r_1$ from the transmitting antenna, a first subtended angle $\theta_1$ from the transmitting antenna and a first modulus angle, $\theta_{1mod}$; the second set having a second radial distance $r_2$ from the transmitting antenna, a second subtended angle $\theta_2$ from the transmitting antenna and a second modulus angle, $\theta_{2mod}$; a control unit for:

(a) determining the first radial distance $r_1$ relative to the magnetic field strength proportional to a RSSI measurement and a first subtended angle $\theta_1$;

(b) determining the second radial distance $r_2$ relative to the magnetic field strength proportional to a RSSI measurement and a second subtended angle $\theta_2$;

(c) determining the theoretical magnetic field ratio dependent on $\theta_1$, $\theta_2$ and relative rotations $\theta_{2mod}$, $\theta_{1mod}$ respectively;

(d) solving for either of $\theta_1$ and $\theta_2$ or $\theta_{1mod}$ and $\theta_{2mod}$; and determining a set of solutions for the first subtended angle $\theta_1$ and second subtended angle $\theta_2$ which satisfies the orientation of the transmitting antenna thereby allowing determination of the direction of the transmitting antenna;

(e) for the set of solutions of the first subtended angle $\theta_1$ and second subtended angle $\theta_2$, minimising the error between the RSSI and a theoretical magnetic field strength; and (f) selecting the one or more solutions that converge in response to movement of the transmitting antenna.

* * * * *